(12) United States Patent
Gopalapuram et al.

(10) Patent No.: US 9,722,944 B2
(45) Date of Patent: Aug. 1, 2017

(54) RATE ADAPTATION ACROSS ASYNCHRONOUS FREQUENCY AND PHASE CLOCK DOMAINS

(71) Applicant: VINTOMIE NETWORKS B.V., LLC, Dover, DE (US)

(72) Inventors: Praveen Gopalapuram, Roseville, CA (US); Mani Kumaran, Milpitas, CA (US); Tamleigh Ross, Sacramento, CA (US)

(73) Assignee: VINTOMIE NETWORKS B.V., LLC, Dover, DE (US)

( * ) Notice: Subject to any disclaimer, the term of this patent is extended or adjusted under 35 U.S.C. 154(b) by 62 days.

(21) Appl. No.: 14/683,669

(22) Filed: Apr. 10, 2015

(65) Prior Publication Data

US 2015/0215227 A1    Jul. 30, 2015

Related U.S. Application Data

(60) Continuation of application No. 14/629,190, filed on Feb. 23, 2015, now abandoned, which is a continuation of application No. 13/087,027, filed on Apr. 14, 2011, now Pat. No. 8,964,578, which is a
(Continued)

(51) Int. Cl.
| | | |
|---|---|---|
| *H04L 12/873* | (2013.01) | |
| *H04L 12/863* | (2013.01) | |
| *G06F 1/10* | (2006.01) | |
| *H03L 7/00* | (2006.01) | |
| *H04B 3/32* | (2006.01) | |
| *H04L 25/02* | (2006.01) | |
| *H04L 12/26* | (2006.01) | |
| *H04L 12/825* | (2013.01) | |
| *H04L 12/925* | (2013.01) | |
| *H04J 3/06* | (2006.01) | |

(52) U.S. Cl.
CPC ............ *H04L 47/6245* (2013.01); *G06F 1/10* (2013.01); *H03L 7/00* (2013.01); *H04B 3/32* (2013.01); *H04L 25/0278* (2013.01); *H04L 43/16* (2013.01); *H04L 47/25* (2013.01); *H04L 47/521* (2013.01); *H04L 47/6215* (2013.01); *H04L 47/722* (2013.01); *H04J 3/0697* (2013.01)

(58) Field of Classification Search
None
See application file for complete search history.

(56) References Cited

U.S. PATENT DOCUMENTS 3,789,146 A    1/1974 Major
3,919,685 A    11/1975 Haill
(Continued)

*Primary Examiner* — Steven H Nguyen
(74) *Attorney, Agent, or Firm* — Dorsey & Whitney LLP

(57) ABSTRACT

A rate adaptation system includes a barrel shift slot register and a rate adaptation register. The barrel shift slot register includes a plurality of slots with one of a valid read request or a dummy read request. A rate adaptation register is configured to sequentially cycle through the slots of the barrel shift register in response to a clock providing valid read requests to a FIFO buffer and to skip provision of valid read requests for clock cycles of the first clock associated with slots that include dummy read requests. The rate adaption register may also receive data blocks from the FIFO buffer and provide those data blocks to another FIFO buffer.

16 Claims, 2 Drawing Sheets

Related U.S. Application Data division of application No. 12/012,725, filed on Feb. 1, 2008, now abandoned.

(60) Provisional application No. 60/900,180, filed on Feb. 7, 2007.

(56) References Cited

U.S. PATENT DOCUMENTS

| | | | |
|---|---|---|---|
| 3,942,163 A * | 3/1976 | Goyal | G11C 19/287 257/236 |
| 4,153,882 A | 5/1979 | Fisher et al. | |
| 4,389,694 A | 6/1983 | Cornwell | |
| 4,463,443 A * | 7/1984 | Frankel | G06F 5/10 710/60 |
| 4,688,268 A | 8/1987 | Holland | |
| 4,987,559 A * | 1/1991 | Miyauchi | G11C 7/1075 365/189.04 |
| 5,305,109 A | 4/1994 | Harford | |
| 5,386,590 A | 1/1995 | Dolan | |
| 5,436,933 A | 7/1995 | Andruzzi | |
| 5,479,398 A * | 12/1995 | Cyr | H04J 3/047 370/537 |
| 5,539,771 A | 7/1996 | Noda et al. | |
| 5,727,006 A | 3/1998 | Dreyer et al. | |
| 5,768,301 A | 6/1998 | Dreyer et al. | |
| 6,064,326 A | 5/2000 | Krone et al. | |
| 6,178,161 B1 | 1/2001 | Terry | |
| 6,351,509 B1 | 2/2002 | Vitenberg et al. | |
| 6,400,772 B1 | 6/2002 | Chaplik | |
| 6,466,989 B1 | 10/2002 | Chu et al. | |
| 6,782,096 B1 | 8/2004 | Bremer et al. | |
| 6,823,028 B1 | 11/2004 | Phanse | |
| 6,982,557 B1 | 1/2006 | Lo et al. | |
| 7,215,763 B1 | 5/2007 | Keller et al. | |
| 7,668,624 B2 | 2/2010 | Heber et al. | |
| 8,477,768 B2 * | 7/2013 | Jeanne | G06F 5/12 370/360 |
| 2002/0089361 A1 * | 7/2002 | Stubbs | G11C 7/1051 327/161 |
| 2002/0129215 A1 * | 9/2002 | Yoo | G06F 13/4273 711/167 |
| 2002/0196863 A1 | 12/2002 | Kaku et al. | |
| 2003/0227966 A1 | 12/2003 | Im | |
| 2004/0208652 A1 | 10/2004 | Nagatomo et al. | |
| 2004/0239388 A1 * | 12/2004 | Lee | H03K 5/131 327/158 |
| 2004/0258236 A1 | 12/2004 | Bremer et al. | |
| 2005/0243903 A1 | 11/2005 | Agazzi | |
| 2006/0034359 A1 | 2/2006 | Hauptmann et al. | |
| 2007/0081551 A1 | 4/2007 | Oishi et al. | |
| 2007/0165426 A1 | 7/2007 | Kyono | |
| 2007/0177701 A1 * | 8/2007 | Thanigasalam | H04J 3/062 375/372 |
| 2008/0043992 A1 | 2/2008 | Hurwitz | |
| 2009/0225648 A1 | 9/2009 | Gopalapuram et al. | |
| 2009/0259893 A1 | 10/2009 | Gopalapuram et al. | |
| 2011/0193536 A1 | 8/2011 | Dyer | |
| 2015/0207718 A1 | 7/2015 | Dyer et al. | |

* cited by examiner

RATE ADAPTATION ACROSS ASYNCHRONOUS FREQUENCY AND PHASE CLOCK DOMAINS

CROSS-REFERENCE TO RELATED APPLICATIONS

This application is a continuation of pending U.S. patent application Ser. No. 14/629,190 filed Feb. 23, 2015, which application is a continuation of U.S. patent application Ser. No. 13/087,027, filed Apr. 14, 2011, and issued as U.S. Pat. No. 8,964,578 on Feb. 24, 2015, which application is a divisional of U.S. application Ser. No. 12/012,725, filed Feb. 1, 2008, now abandoned, which claims priority to provisional application No. 60/900,180, filed Feb. 7, 2007. These prior applications and patent are incorporated herein by reference, in their entirety, for any purpose.

FIELD OF THE INVENTION

The invention relates generally to electronic communication systems. More particularly, the invention relates to a training pattern to enable recognition of proper wire-pair orientation and correction in electronic communication systems.

BACKGROUND

In Ethernet 10GBase-T cabling, the data is sent over four pairs of wires. Between the transmitter and receiver, the pairs can be swapped with each other, and the wires in a pair can be swapped. These reconfigurations can result in an inverted signal or the latency of the four pairs can differ. 10GBASE-T, or IEEE 802.3an-2006, is a standard to provide 10 gigabit/second connections over conventional unshielded or shielded twisted pair cables, over distances up to 100 m. This standard mandates specific training patterns to enable recognition of the proper correction, but does not provide a means to find the proper corrections from all the possibilities. Accordingly, there is a need to develop an algorithm to efficiently search the possible corrections and identify the correct one.

BRIEF DESCRIPTION OF THE DRAWINGS

Features, aspects and potential advantages of the present disclosure will become apparent from the following detailed description of various embodiments, when taken in conjunction with the accompanying drawings, in which.

DETAILED DESCRIPTION

Details of various embodiments of the present invention are disclosed in the following appendices:

Appendix A.
Appendix B.
Appendix C.

Figure 1:
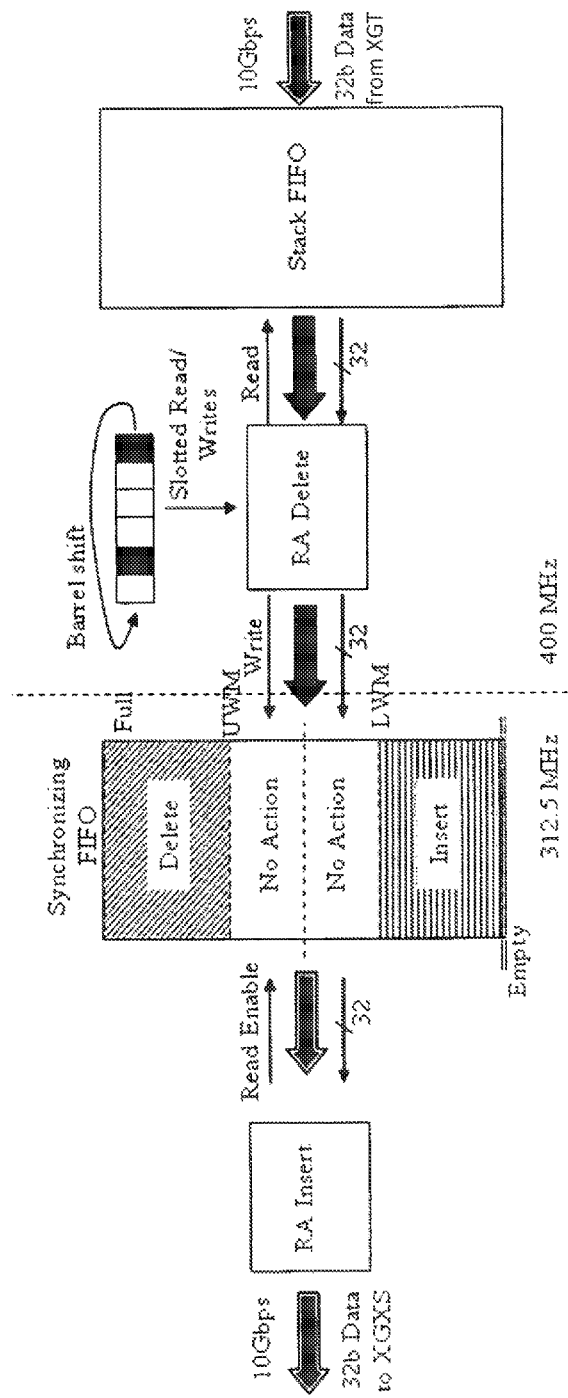
FIGS. 1 and 2 are block diagrams of example systems in accordance with embodiments of the present disclosure.
Figure 2:
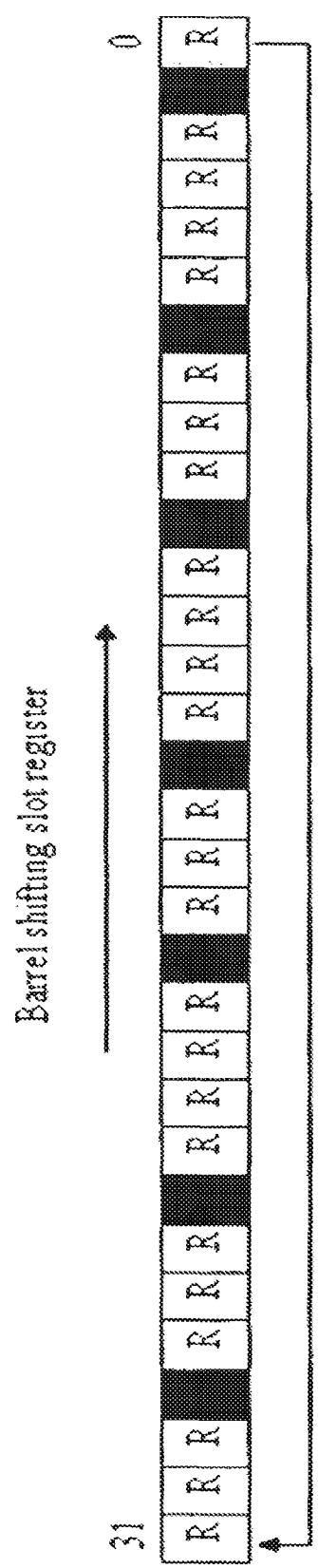

FIG. 1 depicts a rate adaptation system that includes a barrel shift slot register and a rate adaptation register. FIG. 2 depicts an embodiment of the barrel shift slot register in accordance with the rate adaptation system of FIG. 1. In the example, the 10 Gpbs bandwidth corresponds to an input bandwidth of 10000 Mbps. An XGT interface may be based on an XGT clock of 800 MHz. In the example, an XGT clock may include a derivative or divided clock. For example, a PCS-AN interface may include a 400 MHz clock. As depicted in FIG. 1, the XGT interface is divided to support a 400 MHz clock. In an example, the 800 MHz clock on the XGT interface may be divided by a divide-by-2 of the 800 MHz clock. Both the PCS-AN interface and XGT interface represent interfaces that may provide data according to different 10GBASE-T standard protocols.

When using the 400 MHz clock of XGT interface, the output bandwidth may not correspond to the input bandwidth under some circumstances. In an example, a 32-bit wide datapath, a 400 MHz clock, and a 100000 Mbps bandwidth, a 128000 Mbps bandwidth may be outputted as an output bandwidth. This may not allow the system to adapt to a higher bandwidth. The XGT interface may have more data than it can handle. Accordingly, FIG. 1 depicts a rate adaptation system that supports an input bandwidth of 10000 Mbps and an output bandwidth of 10000 Mbps.

The rate adaptation system described herein may adapt a clock rate difference (e.g., ppm difference) across different clock domains (e.g., asynchronous clock domains differing in frequency and phase) without using a PLL or other clock generation circuit to create same frequency clocks. The rate adaptation system described here in utilizes the fact that different clock frequencies include a whole number ratio. For example a clock frequency with a whole number ratio may be deployed in circuitry, such as the XGT interface or the XGXS interface. Accordingly, a 32-bit wide databus can be manipulated to maintain bandwidth at both ends of the rate adaptation system. In an example, an input bandwidth may be required to equal the output bandwidth except for the standard allowed ppm.

As depicted in FIG. 1, the rate adaptation ("RA") system may include a slotting scheme employed to match the bandwidth across the rate adaptation FIFOs. The slotted scheme and the addition of the Stack FIFO does not increase or decrease performance of the rate adaptation engine. The supported clock difference may be 200 ppm. As illustrated in FIG. 1, a 32 bit data signal is received at a 10 Gbps bandwidth from an XGT interface. The datapath may include a datapath from the XGT interface (e.g., PCS-AN) to the XGXS. As illustrated in FIG. 1, a 32 bit data signal is sent at a 10 Gbps bandwidth to the XGXS interface. The clock rate of the PCS-AN may be 400 MHz. The clock rate of the XGXS may be 312.5 MHZ.

FIG. 1 depicts the rate adaptation between the XGXS and the PCS-AN. The rate adaptation system may utilize a slotted scheme of reading from the synchronizing FIFO to limit the XGT interface bandwidth to 10000 Mbps (e.g., 10 Gbps). In an example, the scheme may rate adapt data from the XGXS interface to the XGT interface, or vice versa. As depicted, incoming 32-bit data signal is received at the Stack FIFO. The stack FIFO receives a read signal. The stack FIFO outputs the 32-bit data signal to the Rate Adapt ("RA") delete. The RA receives slotted read/writes from the barrel shift slot register. As described herein, the barrel shift slot register may allow other components (e.g., the RA delete block) of FIG. 1 to read valid read requests or dummy read requests (e.g., invalid read requests). The RA delete block sends a write signal to the synchronizing FIFO.

The synchronizing FIFO of FIG. 1 includes slots for Delete, from Full to Upper Water Mark ("UWM"); slots for No Action; and slots for Insert, from Lower Water Mark ("LWM") to Empty. The RA delete block provides the data signal to the synchronizing FIFO according to the output received from the barrel shift slot register. Accordingly the RA delete block provides data that was received at a first clock rate (e.g., 400 MHz) to the synchronizing FIFO, which, in turn, may provide data at a second clock rate (e.g., 312.5 MHz). The synchronizing FIFO provide a 32 bit data signal to a RA Insert, which, in turn, outputs the 32 data bit signal to the XGXS interface at a 10 Gbps rate. The RA Insert may send a Read Enable signal to the synchronizing FIFO.

FIG. 2 depicts an embodiment of the barrel shift slot register in accordance with the rate adaptation system of FIG. 1. RA delete may be configured to shift slotted read/writes from the barrel shift slot register at every clock of the first clock rate (e.g., 400 MHz) of the first interface. The barrel shift register may include Read slots (denoted as 'R' in FIG. 2). FIG. 2 depicts 25 read slots with read requests. The barrel shift slot register also includes dummy slots (denoted as black boxes in FIG. 2), which include no read or write request. FIG. 2 depicts 7 dummy slots. In the example, 25 valid-read requests of 32 available slots corresponds to a number of read requests that a 312.5 MHz clock may process in the same time that a 400 MHz clock processes 32 read requests (e.g., 25/32=second clock rate/first clock rate). That is, for every 32 clocks of the 400 MHz first clock rate, seven reads are invalidated. The seven dummy reads may be distributed to avoid any temporary surges or falls in the FIFO levels. In some cases, dummy reads may not be distributed evenly for the FIFO thresholds, and the distribution of the dummy reads and dummy slots may be adjusted. For example, the barrel shift register may shift dummy slots seven times, as FIG. 2 depicts seven dummy slots. The rate adaptation engine taps any one of the slots while the barrel shift slot register shifts by one every clock at 400 MHz (supplied by XGT).

In an example, a phase locked loop ("PLL") with a clock multiplier can be used to generate a clock that is PPM matched to the destination clock domain but is frequency synchronous to the source clock domain.

As one of ordinary skill in the art will appreciate, various changes, substitutions, and alterations could be made or otherwise implemented without departing from the principles of the present invention. Accordingly, the examples and drawings disclosed herein including the appendix are for purposes of illustrating the preferred embodiments of the present invention and are not to be construed as limiting the invention.

What is claimed is:

1. An rate adaptation system comprising:
   a FIFO buffer configured to:
      receive a plurality of data blocks via a first data bus at a rate based on a first clock; and
      output the plurality of data blocks in response to the first read requests;
   a barrel shift slot register including a plurality of slots, wherein each of the plurality of slots comprise a read slot or a dummy slot, wherein a ratio of a count of read slots including the first read requests from the plurality of slots to a count of the plurality of slots is based on a ratio of a rate of a second clock to a rate of the first clock; and
   an RA delete configured to:
      receive the first read requests from the plurality of slots of the barrel shift register in response to the first clock to provide the first read requests to the FIFO buffer and to receive the plurality of data blocks from the FIFO buffer;
      shift provision of dummy slots for clock cycles of the first clock associated with the dummy slots of the plurality of slots; and
      provide the plurality of data blocks to a synchronizing FIFO.

2. The rate adaptation system of claim 1, wherein the synchronizing FIFO buffer is configured to:
   receive a first plurality data blocks from the RA delete; and
   output the plurality of data blocks in response to second read requests from an RA insert.

3. The rate adaptation system of claim 1, wherein the first data bus is configured to operate according to a 10GBASE-T standard protocol.

4. The rate adaptation system of claim 1, wherein the second data bus is configured to operate according to a 10GBASE-T standard protocol that is different than the 10GBASE-T standard protocol to which the first data bus is configured to operate.

5. The rate adaptation system of claim 1, wherein the frequency of the first clock is greater than the frequency of the second clock.

6. The rate adaptation system of claim 1, wherein the first clock is a 400 MHz clock and the second clock is a 312.5 MHz clock.

7. The rate adaptation system of claim 1, wherein the barrel shift register includes 32 slots.

8. A method comprising:
   receiving a first plurality of data blocks via a first data bus at a first buffer at a rate based on a first clock;
   receiving read requests from read slots of a barrel shift slot register;
   receiving dummy requests from dummy slots of the barrel shift slot register;
   providing the read requests and the dummy requests to the first buffer in response to the first clock, wherein a count of the read requests relative to a total number of requests is based on a ratio of a rate of a second clock to a rate of the first clock, and wherein the total number of requests includes the read requests and the dummy requests; and
   providing the plurality of data blocks to a second buffer in response to the read requests.

9. The method of claim 8, wherein each slot of the barrel shift slot register indicates one of a read request or a dummy request.

10. The method of claim 8, further comprising serially providing the plurality of data blocks to a second data bus.

11. The method of claim 10, further comprising, prior to said providing the plurality of data blocks to a second data bus, retrieving the plurality of data blocks from the second buffer.

12. The method of claim 8, wherein the rate of the first clock is greater than the rate of the second clock.

13. A method comprising:
   shifting slots of a barrel shift register to provide a sequence of read requests, wherein each of the slots of the barrel shift register indicate one of a read request or a dummy request, wherein a count of the read requests relative to a total number of requests included in the sequence of requests is based on a ratio of a rate of a second clock to a rate of the first clock, and wherein the total number of requests includes the read requests and the dummy requests;
   providing, from an RA delete, the sequence of read requests to a first buffer in response to a first clock;
   receiving the plurality of data blocks at the RA delete from the first buffer in response to the sequence of requests; and providing the plurality of data blocks to a second buffer in response to the first clock.

14. The method of claim 13, further comprising providing the plurality of data blocks to a second data bus in response to a second clock.

15. The method of claim 14, further comprising receiving the plurality of data blocks from a first data bus at the first buffer in response to the first clock.

16. The method of claim 15, wherein the second data bus is configured to operate according to a 10GBASE-T standard protocol that is different than the 10GBASE-T standard protocol to which the first data bus is configured to operate.

* * * * *